United States Patent
Oguri et al.

(10) Patent No.: US 10,340,572 B2
(45) Date of Patent: *Jul. 2, 2019

(54) ANTENNA MODULE AND ELECTRONIC DEVICE

(71) Applicant: Murata Manufacturing Co., Ltd., Nagaokakyo-shi, Kyoto-fu (JP)

(72) Inventors: Shinya Oguri, Nagaokakyo (JP); Wataru Tamura, Nagaokakyo (JP); Fumie Matsuda, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/143,576

(22) Filed: Sep. 27, 2018

(65) Prior Publication Data
US 2019/0027801 A1    Jan. 24, 2019

Related U.S. Application Data

(63) Continuation of application No. 15/618,228, filed on Jun. 9, 2017, now Pat. No. 10,122,058, which is a (Continued)

(30) Foreign Application Priority Data

Sep. 25, 2015  (JP) .................................. 2015-187654

(51) Int. Cl.
*H01Q 1/50*   (2006.01)
*H01P 3/08*   (2006.01)
(Continued)

(52) U.S. Cl.
CPC ................ *H01P 3/08* (2013.01); *H01P 3/085* (2013.01); *H01P 5/085* (2013.01); *H01Q 1/50* (2013.01);
(Continued)

(58) Field of Classification Search
CPC .. H01P 3/08; H01P 3/085; H01Q 1/50; H01Q 1/243; H03H 7/38; H05K 1/0251; H05K 1/028
See application file for complete search history.

(56) References Cited

U.S. PATENT DOCUMENTS 6,099,745 A *   8/2000  McKenney ............ H05K 3/062
                                                174/254
6,841,738 B2 *  1/2005  Michiwaki ........... H05K 3/4691
                                                174/254
(Continued)

OTHER PUBLICATIONS

Oguri et al., "Antenna Module and Electronic Device", U.S. Appl. No. 15/618,228, filed Jun. 9, 2017.

*Primary Examiner* — Dameon E Levi
*Assistant Examiner* — David E Lotter
(74) *Attorney, Agent, or Firm* — Keating & Bennett, LLP

(57) ABSTRACT

An antenna module includes a resin multilayer substrate including a plurality of base materials that are flexible. The resin multilayer substrate includes a rigid portion at which a first number of stacked layers of the base materials is relatively large and a flexible portion at which a second number of stacked layers of the base materials is relatively small. A radiating element including a conductor pattern is provided at the rigid portion. A transmission line including a conductor pattern and electrically connected to the radiating element is provided at the flexible portion. A frame-shaped conductor that surrounds the radiating element when viewed in a direction in which the base materials are stacked is provided at either the rigid portion or the flexible portion, or both the rigid portion and the flexible portion.

8 Claims, 13 Drawing Sheets

101

Related U.S. Application Data continuation of application No. PCT/JP2016/074576, filed on Aug. 24, 2016.

(51) Int. Cl.
| | | |
|---|---|---|
| *H03H 7/38* | (2006.01) | |
| *H05K 1/02* | (2006.01) | |
| *H01P 5/08* | (2006.01) | |
| *H01Q 1/24* | (2006.01) | |
| *H01Q 9/04* | (2006.01) | |

(52) U.S. Cl.
CPC ............... *H03H 7/38* (2013.01); *H05K 1/028* (2013.01); *H05K 1/0251* (2013.01); *H01Q 1/243* (2013.01); *H01Q 9/0421* (2013.01); *H05K 1/0221* (2013.01); *H05K 2201/0723* (2013.01); *H05K 2201/09618* (2013.01); *H05K 2201/10098* (2013.01)

(56) References Cited

U.S. PATENT DOCUMENTS

| | | | | |
|---|---|---|---|---|
| 8,188,372 B2* | 5/2012 | Sato | ..................... | H05K 3/4652 |
| | | | | 174/254 |
| 8,383,230 B2* | 2/2013 | Kita | ....................... | H05K 1/028 |
| | | | | 174/254 |
| 9,549,463 B1* | 1/2017 | Vrtis | ................... | H05K 1/0281 |
| 9,661,743 B1* | 5/2017 | Bergman | ................ | H05K 1/18 |
| 2013/0147581 A1* | 6/2013 | Kato | ................... | H05K 1/0253 |
| | | | | 333/238 |

\* cited by examiner

ANTENNA MODULE AND ELECTRONIC DEVICE

CROSS REFERENCE TO RELATED APPLICATIONS

This application claims the benefit of priority to Japanese Patent Application No. 2015-187654 filed on Sep. 25, 2015 and is a Continuation Application of PCT Application No. PCT/JP2016/074576 filed on Aug. 24, 2016. The entire contents of each application are hereby incorporated herein by reference.

BACKGROUND OF THE INVENTION

1. Field of the Invention

The present invention relates to an antenna module including a radiating element and an electronic device including the antenna module.

2. Description of the Related Art

An antenna with a transmission line disclosed in International Publication No. 2011/021677 is known as an invention related to an antenna module.

International Publication No. 2011/021677 discloses an antenna module including a radiating element and a transmission line portion that are integrally formed on a multilayer body obtained by stacking insulation sheets having flexibility. In the antenna module disclosed in International Publication No. 2011/021677, the multilayer body, which is the main body of the antenna module, is obtained by stacking the insulation sheets having flexibility, and accordingly, the transmission line portion can easily deform into a shape following a space for the location of installation.

However, since the multilayer body as a whole has flexibility, not only the transmission line portion, but also a radiating-element defining portion easily deforms. This is a problem to be solved in view of stability of the electrical characteristics of the antenna. That is, in the case where the radiating-element defining portion deforms from a flat shape to a given shape and the shape is stable, antenna characteristics in this state can be designed. However, for example, in the case where the radiating-element defining portion deforms in accordance with the state of installation in a housing, the antenna characteristics varies depending on the accuracy of installation.

SUMMARY OF THE INVENTION

Preferred embodiments of the present invention provide antenna modules that significantly reduce or prevent variations in antenna characteristics due to unintentional deformation of the radiating-element defining portion, while maintaining the flexibility of the transmission line portion, and electronic devices including the antenna modules.

An antenna module according to a preferred embodiment of the present invention includes a resin multilayer substrate including a plurality of base materials having flexibility. The resin multilayer substrate includes a rigid portion at which a first number of stacked layers of the base materials is relatively large and a flexible portion at which a second number of stacked layers of the base materials is relatively small. A radiating element defined by a conductor pattern is provided at the rigid portion. A transmission line defined by a conductor pattern and electrically connected to the radiating element is provided at the flexible portion. A frame-shaped conductor that surrounds the radiating element when viewed in a direction in which the base materials are stacked is provided at either the rigid portion or the flexible portion, or both the rigid portion and the flexible portion.

With the structure described above, the radiating element is provided at the rigid portion at which the first number of stacked layers of the base materials is relatively large, and the frame-shaped conductor that surrounds the radiating element when viewed in a direction in which the base materials are stacked is provided at the resin multilayer substrate. Accordingly, unprepared deformation of the radiating element is able to be significantly reduced or prevented.

The transmission line preferably includes a ground conductor and a signal line, and the radiating element is preferably provided at one of the base materials different from one of the base materials at which the signal line is formed, for example. A first interlayer connection conductor that electrically connects the signal line and the radiating element to each other is preferably provided in the rigid portion, for example. The first interlayer connection conductor is preferably non-linear, for example.

With the structure described above, the first interlayer connection conductor has pliability or elasticity and thus damage to the first interlayer connection conductor by an internal stress due to a bend of the rigid portion is able to be significantly reduced or prevented. The longer the length of the first interlayer connection conductor and the higher the self-induction of the first interlayer connection conductor, the higher the inductance of the first interlayer connection conductor. Consequently, the first interlayer connection conductor defines and functions as an inductance element electrically connected to a feed point of the radiating element and is able to be used as a portion of an antenna matching circuit.

A second interlayer connection conductor that electrically connects the ground conductor and the radiating element to each other is preferably provided in the rigid portion, for example. The second interlayer connection conductor is preferably non-linear, for example. In this case, the second interlayer connection conductor has pliability or elasticity and thus damage to the second interlayer connection conductor by an internal stress due to a bend of the rigid portion is able to be significantly reduced or prevented.

The flexible portion preferably bends, for example. Accordingly, the antenna module is able to be readily installed, for example, in a limited space in a housing.

The rigid portion preferably bends in a first direction in which the transmission line extends or a second direction perpendicular or substantially perpendicular to the first direction, for example. The rigid portion is able to be bent in advance to follow the shape of the location of installation. Accordingly, the antenna module is able to be easily installed. In addition, variations in the antenna characteristics due to the deformation of the rigid portion during installing are able to be significantly reduced or prevented.

The flexible portion preferably includes a matching circuit of an antenna including the radiating element, for example. Thus, the impedance of the antenna attributed to the radiating element is able to be matched with the characteristic impedance of the transmission line by using the matching circuit of the antenna. Accordingly, the radiating element is able to be readily and easily designed. In addition, a return loss due to impedance mismatching is significantly reduced or prevented and the efficiency of the antenna is able to be improved.

An electronic device according to a preferred embodiment of the present invention includes the antenna module as described above, a circuit substrate at which a high-frequency circuit electrically connected to the antenna module is disposed, and a housing accommodating the antenna module and the circuit substrate.

The structure described above provides an electronic device in which the antenna module is installed in a limited space in the housing with stable characteristics.

According to various preferred embodiments of the present invention, antenna modules that significantly reduce or prevent variations in the antenna characteristics due to unintentional deformation of the radiating-element defining portion while maintaining the flexibility of the transmission line portion are obtained, and electronic devices including the antenna modules are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
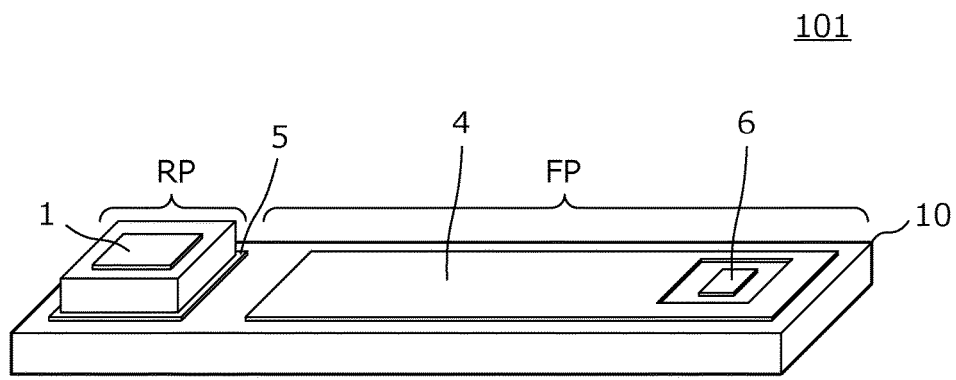
FIG. 1 is a perspective view of an antenna module according to a first preferred embodiment of the present invention.

Specific examples will hereinafter be provided with reference to the drawings to describe preferred embodiments of the present invention. In the drawings, like components are designated by like reference signs. In consideration for description of main points and understandability, the preferred embodiments are separately described for convenience. However, structures described in different preferred embodiments are able to be partially replaced or combined. In second and following preferred embodiments, description of common features and elements to those in a first preferred embodiment is omitted, and only different features and elements are described. In particular, the same or similar effects achieved by the same or similar structure are not repeated in each preferred embodiment.

First Preferred Embodiment

According to a first preferred embodiment of the present invention, an antenna module having a basic structure and including a transmission line and a radiating element is described below.

Figure 2:
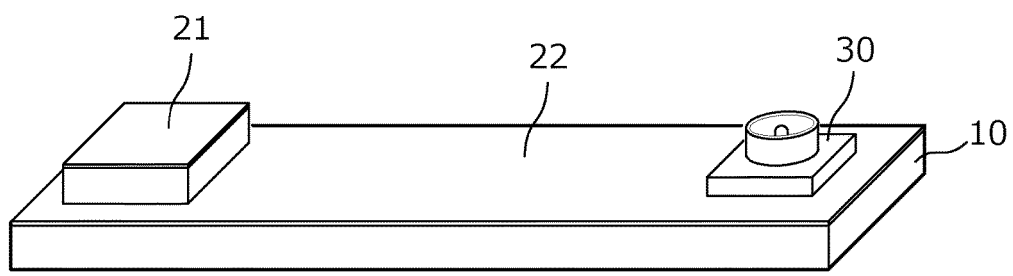
FIG. 2 is a perspective view of an antenna module according to the first preferred embodiment of the present invention in a state where cover lays and a connector are disposed on the antenna module.

FIG. 1 is a perspective view of an antenna module 101 according to the first preferred embodiment. FIG. 2 is a perspective view of an antenna module 101S in a state where cover lays 21 and 22 and a connector 30 are disposed on the antenna module 101.

As shown in FIG. 1, the antenna module 101 includes a resin multilayer substrate 10. The resin multilayer substrate includes a rigid portion RP that is relatively hard and a flexible portion FP that is relatively flexible or soft. A radiating element 1 defined by a conductor pattern is provided on the rigid portion RP. A transmission line electrically connected to the radiating element 1 is provided at the flexible portion FP. A frame-shaped conductor 5 that surrounds the radiating element 1 in plan view is provided in a boundary area between the rigid portion RP and the flexible portion FP. The rigidity of the rigid portion RP is relative, which means that the rigid portion RP is less flexible than the flexible portion FP. Accordingly, the rigid portion RP may have some flexibility and is a portion that may bend.

In a state shown in FIG. 1, a second ground conductor and a connector connecting conductor 6 of the transmission line are exposed from the upper surface of the antenna module 101. The antenna module 101S with a connector preferably includes the connector 30 that is electrically connected to the second ground conductor 4 and the connector connecting conductor 6 and the cover lays 21 and 22 coated on the upper surface of the resin multilayer substrate 10.

Figure 3:
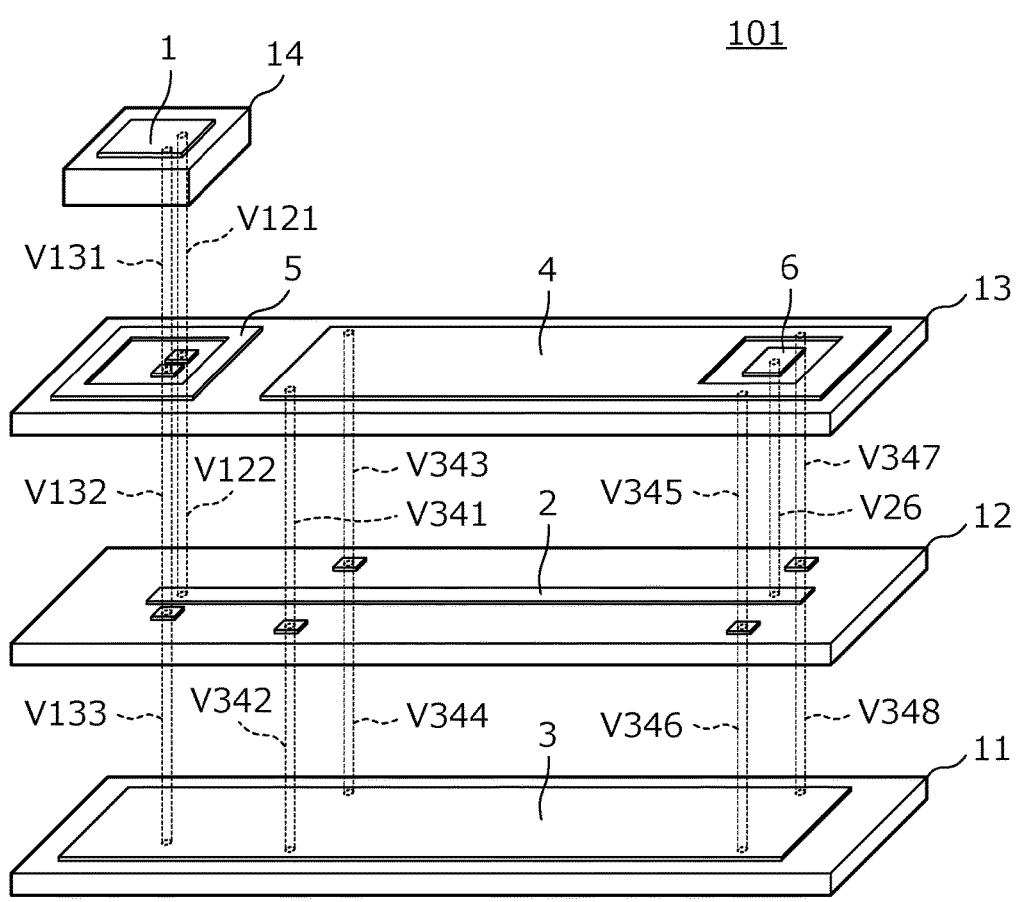
FIG. 3 is an exploded perspective view of the antenna module shown in FIG. 1.
Figure 4:
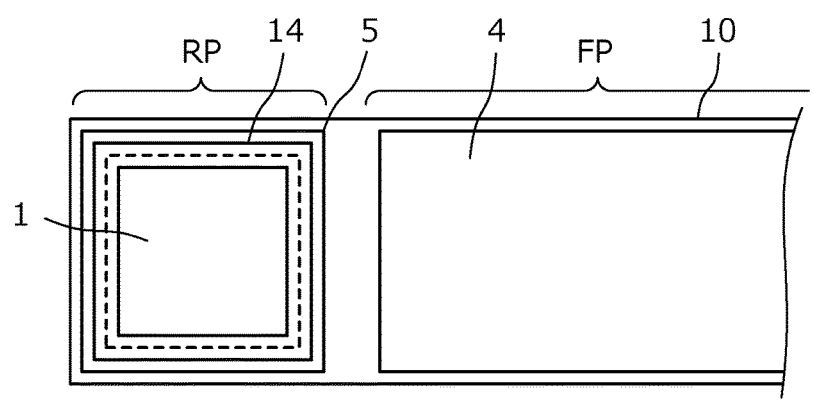
FIG. 4 is a plan view of a portion of the antenna module shown in FIG. 1.
Figure 5:
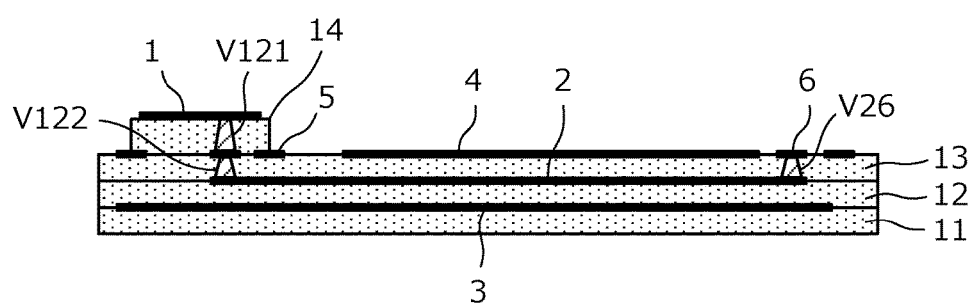
FIG. 5 is a sectional view of the antenna module shown in FIG. 1.

FIG. 3 is an exploded perspective view of the antenna module 101. FIG. 4 is a plan view of a portion of the antenna module 101. FIG. 5 is a sectional view of the antenna module 101.

The resin multilayer substrate 10 shown in FIG. 1 includes base materials 11, 12, 13, and 14 having flexibility. The flexible portion FP corresponds to a portion at which the base materials 11, 12, and 13 are stacked, and the rigid portion RP corresponds to a portion at which the base materials 11, 12, 13, and 14 are stacked. Each of the base materials 11, 12, 13, and 14 preferably is a thermoplastic resin such as a liquid-crystal polymer (LCP) and has flexibility. The total thickness of the stack varies depending on the total number of stacked layers of the base materials. The rigid portion RP corresponds to a portion with a greater total thickness, and the flexible portion FP corresponds to a portion with a thinner total thickness. Copper foil conductor patterns patterned by photolithography are formed on the base materials 11, 12, 13, and 14. The conductor patterns are not limited to copper foil conductor patterns and may be conductor patterns of another metallic foil, for example.

A signal line 2 is provided on the base material 12. A first ground conductor 3 is provided on the base material 11. The second ground conductor 4 is provided on the base material 13. Interlayer connection conductors V341, V343, V345, and V347 are provided in the base material 13. Interlayer connection conductors V342, V344, V346, and V348 are provided in the base material 12. The first ground conductor 3 and the second ground conductor 4 are electrically connected to each other with the interlayer connection conductors V341, V343, V345, V347, V342, V344, V346, and V348 interposed therebetween. The signal line 2 is interposed between the first ground conductor 3 and the second ground conductor 4. The first ground conductor 3, the second ground conductor 4, and the signal line 2 define the transmission line with a stripline structure.

Interlayer connection conductors V121 and V131 are provided in the base material 14. Interlayer connection conductors V122 and V132 are provided in the base material 13. An interlayer connection conductor V133 is provided in the base material 12. A first end portion of the signal line 2 is electrically connected to the feed point of the radiating element 1 with the interlayer connection conductors V122 and V121 interposed therebetween. A ground point of the radiating element 1 is electrically connected to the first ground conductor 3 with the interlayer connection conductors V131, V132, and V133 interposed therebetween.

An interlayer connection conductor V26 is provided in the base material 13. A second end portion of the signal line 2 is electrically connected to the connector connecting conductor with the interlayer connection conductor V26 interposed therebetween.

The frame-shaped conductor 5 that surrounds the radiating element 1 when viewed in the direction in which the base materials 11 to 14 are stacked is provided on the base material 13. The frame-shaped conductor 5 is electrically isolated from the radiating element 1, the signal line 2, and the ground conductors 3 and 4.

The base materials shown in FIG. 3, on which the corresponding conductor patterns are provided, are stacked and subjected to hot pressing to form the antenna module 101 shown in FIG. 1. The cover lays 21 and 22, for example, solder resists, are subsequently coated as desired. The connector 30 is attached to the connector connecting conductor 6 and the second ground conductor 4, to provide the antenna module 101S shown in FIG. 2.

With the structure described above, the radiating element 1 is provided on the rigid portion and surrounded by the frame-shaped conductor in plan view. Accordingly, deformation of the radiating element is significantly reduced or prevented. In addition, the frame-shaped conductor 5 does not block or scarcely blocks an electric field produced between the radiating element 1 and the first ground conductor 3. Accordingly, the frame-shaped conductor 5 does not significantly degrade the antenna characteristics.

Figure 6A:
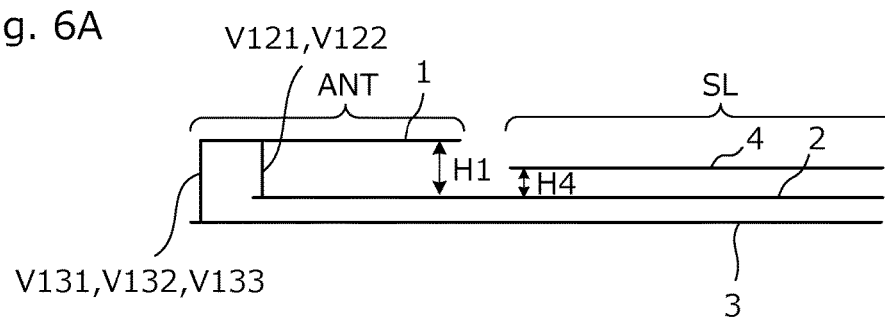
FIG. 6A is a sectional view of a simplified electrical structure of a radiating element and a transmission line of the antenna module shown in FIG. 1.
Figure 6B:
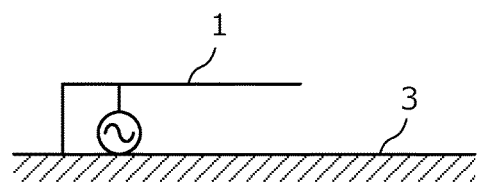
FIG. 6B is a configuration diagram of an antenna including the radiating element and a first ground conductor of the antenna module shown in FIG. 1.

FIG. 6A is a sectional view of a simplified electrical structure of the radiating element and the transmission line of the antenna module 101. FIG. 6B is a configuration diagram of an antenna defined by the radiating element 1 and the first ground conductor of the antenna module 101.

As shown in FIG. 6B, the antenna defines and functions as a plate-shaped inverse F antenna (PIFA) in which a portion of the edge of the radiating element 1 is grounded and power is supplied through the feed point. As shown in FIG. 6A, the ground conductor of the plate-shaped inverse F antenna (PIFA) and the first ground conductor 3 of the transmission line are in the same layer (at the same or substantially the same height position). A height H1 from the signal line 2 to the radiating element 1 is greater than a height H4 from the signal line 2 to the second ground conductor 4. With this structure, for example, a capacitance between the radiating element 1 and the first ground conductor 3 is able to be adjusted while the characteristic impedance of the transmission line is maintained at or near a predetermined value. In the case where H1>H4 holds, a predetermined length of each of the interlayer connection conductors V121 and V122 is ensured, and an inductance component is applied to a power supply passage to the feed point of the radiating element 1. The inductance component attributed to the interlayer connection conductors is able to be used as a portion of an antenna matching circuit.

Second Preferred Embodiment

According to a second preferred embodiment of the present invention, an antenna module in which an antenna matching circuit is actively disposed in the resin multilayer substrate 10 is described below.

Figure 7:
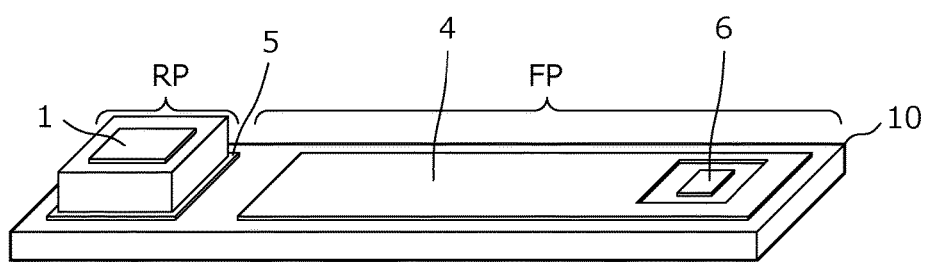
FIG. 7 is a perspective view of an antenna module according to a second preferred embodiment of the present invention.
Figure 8:
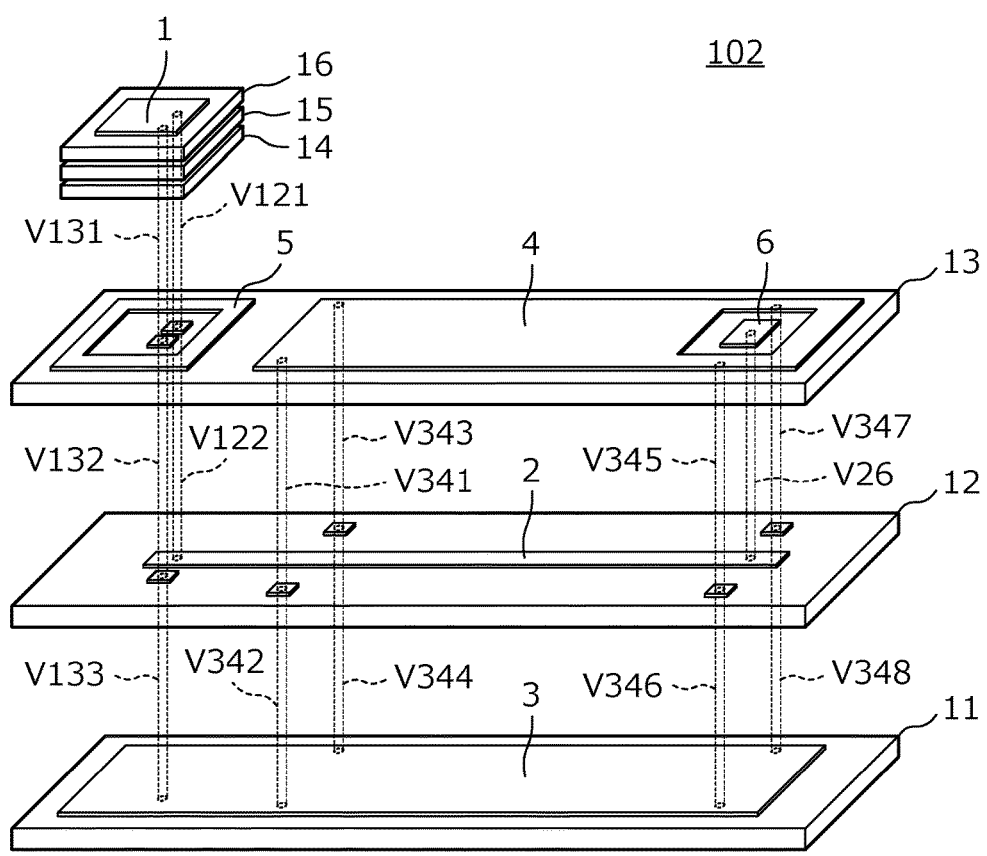
FIG. 8 is an exploded perspective view of the antenna module according to the second preferred embodiment of the present invention.
Figure 9A:
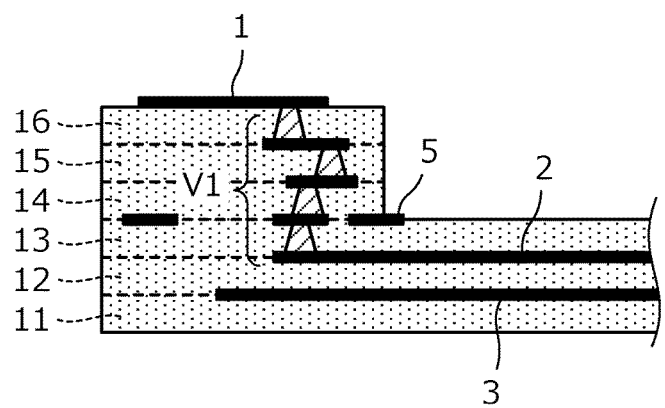
FIGS. 9A and 9B are sectional views of a portion of the antenna module shown in FIG. 7.
Figure 9B:
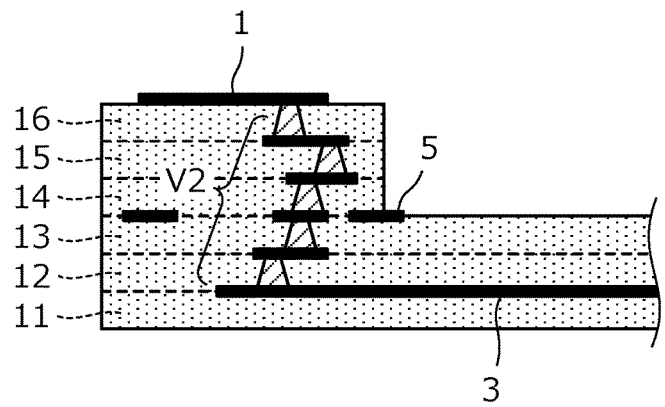

FIG. 7 is a perspective view of an antenna module 102 according to the second preferred embodiment. FIG. 8 is an exploded perspective view of the antenna module 102 according to the second preferred embodiment. FIGS. 9A and 9B are sectional views of a portion of the antenna module 102.

The structure of a portion at which base materials 14, 15, and 16 are stacked is a difference from the antenna module 101 according to the first preferred embodiment shown in FIG. 3.

The resin multilayer substrate 10 includes the base materials 11, 12, 13, 14, 15, and 16 having flexibility. The flexible portion FP corresponds to a portion at which the base materials 11, 12, and 13 are stacked, and the rigid portion RP corresponds to a portion at which the base materials 11, 12, 13, 14, 15, and 16 are stacked.

FIG. 9A is a sectional view of a portion including a first interlayer connection conductor V1 that electrically connects the first end portion of the signal line 2 and the feed point of the radiating element 1 to each other. As shown in FIG. 9A, interlayer connection conductors are provided in the respective base materials 13, 14, 15, and 16 and the first interlayer connection conductor V1 includes these interlayer connection conductors.

FIG. 9B is a sectional view of a portion including a second interlayer connection conductor V2 that electrically connects the first ground conductor and the ground point of the radiating element 1 to each other. As shown in FIG. 9B, interlayer connection conductors are provided in the respective base materials 12, 13, 14, 15, and 16. The second interlayer connection conductor V2 includes these interlayer connection conductors.

As shown in FIG. 9A, the first interlayer connection conductor V1 extending through the base materials 13, 14, 15, and 16 is non-linear. That is, the first interlayer connection conductor V1 does not extend straight with respect to the direction in which the base materials are stacked. With this structure, the first interlayer connection conductor V1 has pliability or elasticity and thus damage to the first interlayer connection conductor by an internal stress due to a bend of the rigid portion is able to be significantly reduced or prevented. The longer the length of the first interlayer connection conductor V1 and the higher the self-induction of the first interlayer connection conductor V1, the higher the inductance of the first interlayer connection conductor V1. Consequently, the first interlayer connection conductor V1 defines and functions as an inductance element electrically connected to the feed point of the radiating element 1 and is able to be used as a portion of the antenna matching circuit.

As shown in FIG. 9B, the second interlayer connection conductor V2 extending through the base materials 12, 13, 14, 15, and 16 is non-linear. That is, the second interlayer connection conductor V2 does not extend straight with respect to the direction in which the base materials are stacked. Thus, the second interlayer connection conductor V2 has pliability or elasticity and thus damage to the second interlayer connection conductor by an internal stress due to a bend of the rigid portion is able to be significantly reduced or prevented.

The first interlayer connection conductor V1 and the second interlayer connection conductor V2 may have a longitudinal section, for example, in a shape of a meander line. The first interlayer connection conductor V1 and the second interlayer connection conductor V2 may be three-dimensional, for example, a helical structure whose axis coincides with the direction in which the base materials are stacked. These shapes allow the inductance component to increase.

Third Preferred Embodiment

According to a third preferred embodiment of the present invention, an example of an antenna module including an antenna matching circuit is described below.

Figure 10:
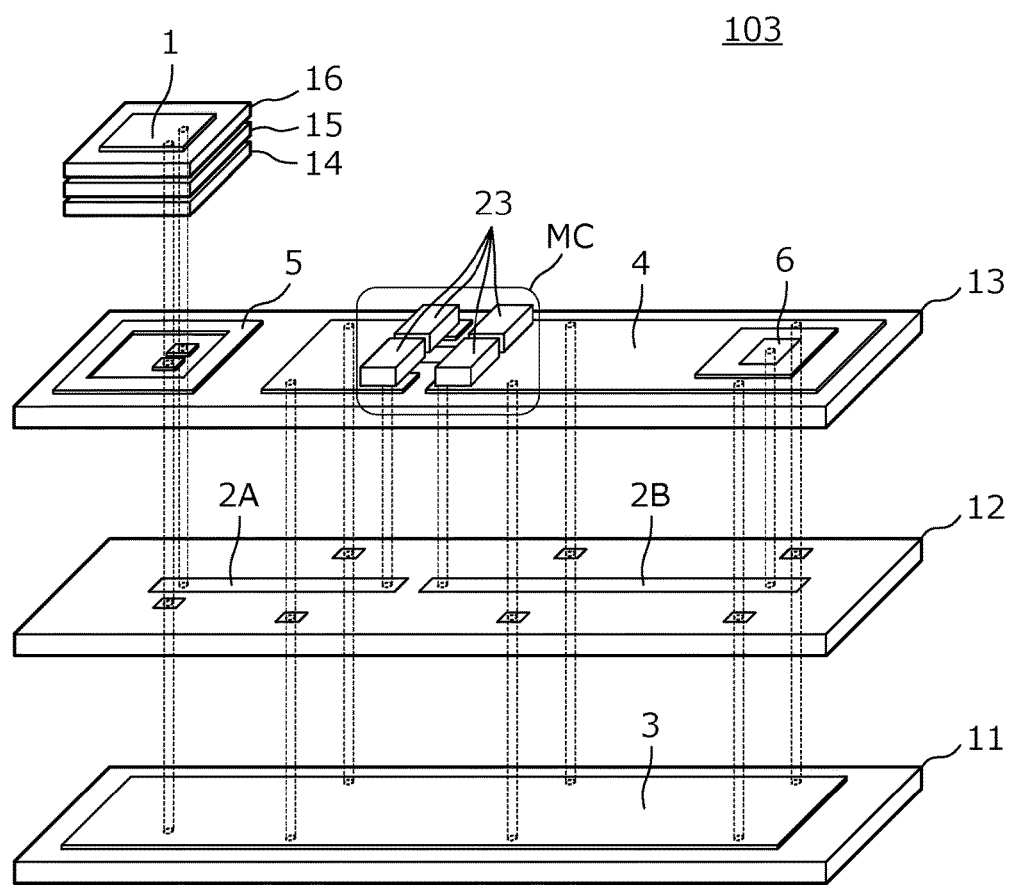
FIG. 10 is an exploded perspective view of an antenna module according to a third preferred embodiment of the present invention.

FIG. 10 is an exploded perspective view of an antenna module 103 according to the third preferred embodiment. In contrast to the antenna module 102 according to the second preferred embodiment shown in FIG. 8, the antenna module 103 according to the third preferred embodiment includes an antenna matching circuit MC with electronic components 23 that are separated from the base materials and the conductor patterns provided on the base materials. The antenna module 103 also differs from the antenna module 102 in that the signal line is divided at a middle position thereof.

Signal lines 2A and 2B are provided on the base material 12. The electronic components 23 are mounted on the base material 13. The electronic components 23 are reactance elements and are electrically connected between the second ground conductor 4 and the signal lines 2A and 2B and between the signal lines 2A and 2B. The antenna matching circuit MC is, for example, a LC low pass filter type circuit, a T-type circuit, or a n-type circuit that includes an inductor and a capacitor. The antenna matching circuit MC may be defined by only the electronic components 23 or may be defined by the electronic components 23 combined with a LC element including conductor patterns and interlayer connection conductors that are provided at the base materials, for example.

According to the third preferred embodiment, the impedance of the antenna attributed to the radiating element 1 is able to be matched or substantially matched with the characteristic impedance of the transmission line by using the antenna matching circuit MC including the separated electronic components 23, and accordingly, the radiating element 1 is able to be readily designed. A return loss due to impedance mismatching is significantly reduced or prevented and the efficiency of the antenna is able to be improved.

Fourth Preferred Embodiment

According to a fourth preferred embodiment of the present invention, an antenna module in which the rigid portion bends is described below.

Figure 11A:
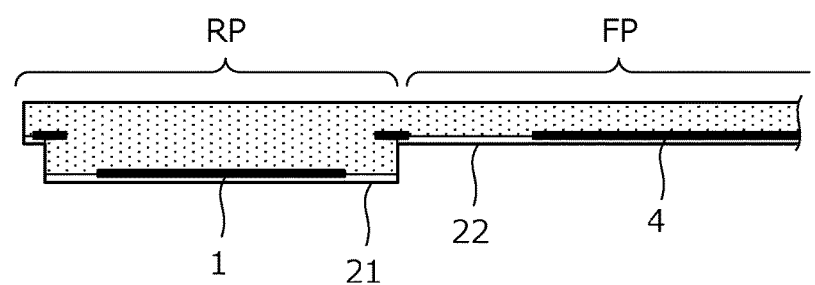
FIG. 11A is a front view of an antenna module according to a fourth preferred embodiment of the present invention.
Figure 11B:
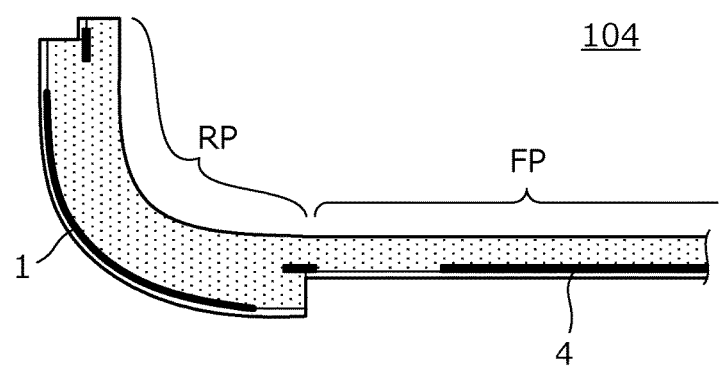
FIG. 11B is a front view of the antenna module shown in FIG. 11A in a state where a rigid portion bends.

FIG. 11A is a front view of an antenna module 104 according to the fourth preferred embodiment. FIG. 11B is a front view of the antenna module 104 in a state where the rigid portion RP bends.

The structure of the antenna module 104 is the same or substantially the same as the structure of any one of the antenna modules 101 to 103 according to the first to third preferred embodiments. The base materials are thermoplastic resins such as liquid-crystal polymers (LCP), although the rigid portion RP is harder than the flexible portion FP. Accordingly, the rigid portion RP is able to be plastically deformed from a state in FIG. 11A to a state in FIG. 11B, with the rigid portion RP being subjected to a bending process while being heated, and the shape is able to be maintained after slow cooling. The frame-shaped conductor 5 which has a Young's modulus larger than that of the base materials enhances the effect of maintaining the shape. For example, in the case where the base materials are liquid-crystal polymers, the Young's modulus is about 1 GPa, and in the case where a metal of which the frame-shaped conductor is composed is Cu (copper foil), the Young's modulus is about 130 GPa. The portion at which the frame-shaped conductor 5 is provided is harder than the portion including only the base materials. The frame-shaped conductor 5 thus defines and functions as a hard member, and accordingly, the effect of maintaining the shape is higher than in the case where there is no frame-shaped conductor 5.

In the case where the rigid portion RP is thus bent in advance to follow the shape of the location of installation, the antenna module 104 is able to be readily installed therein. In addition, variations in the antenna characteristics due to the deformation of the rigid portion RP during installing are able to be significantly reduced or prevented.

Fifth Preferred Embodiment

According to a fifth preferred embodiment of the present invention, an antenna module in which the flexible portion bends and an electronic device including the antenna module is described below.

Figure 12:
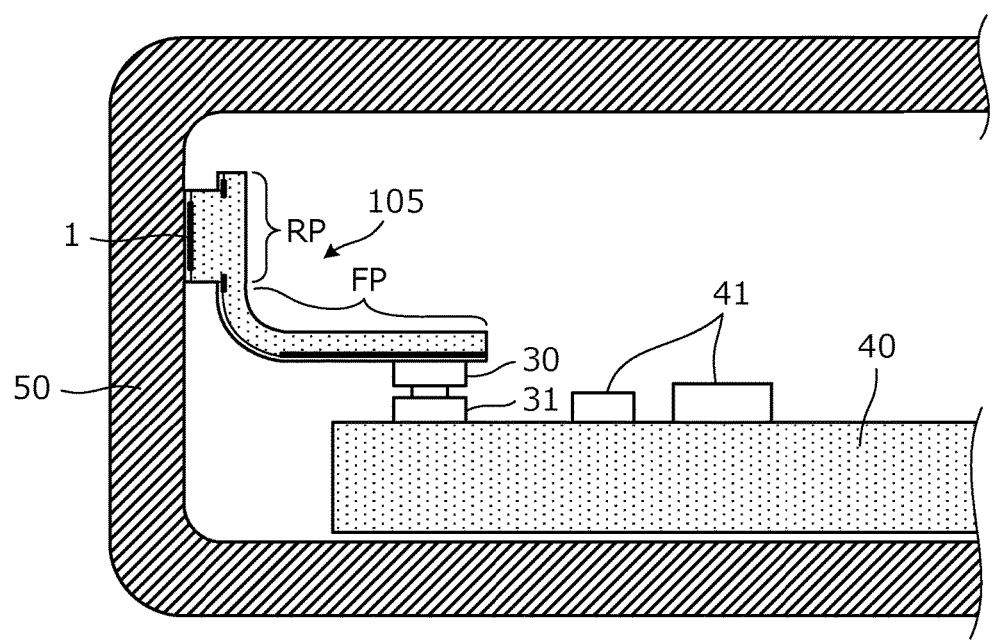
FIG. 12 shows the structure of an antenna module according to a fifth preferred embodiment of the present invention and a principal portion of an electronic device including the antenna module.

FIG. 12 shows the structure of an antenna module 105 according to the fifth preferred embodiment and a principal portion of an electronic device 205 including the antenna module. The structure of the antenna module 105 is the same or substantially the same as the structure of any one of the antenna modules 101 to 103 according to the first to third preferred embodiments.

A receptacle 31 of a coaxial connector and electronic components 41 are mounted on a circuit substrate 40. A high-frequency circuit, for example, a power supply circuit, is provided on the circuit substrate 40. The antenna module 105 is electrically connected with the connector (plug) 30 being attached to the receptacle 31.

A housing 50 of the electronic device is a resin housing that includes no metallic portion at least in a location adjacent to or in a vicinity of the radiating element 1.

The flexible portion FP is able to be bent without being heated. However, previous molding with a press molding machine eliminates the need of molding during installation in the housing of the electronic device.

Sixth Preferred Embodiment

According to a sixth preferred embodiment of the present invention, an antenna module in which the rigid portion and the flexible portion bend and an electronic device including the antenna module is described below.

Figure 13:
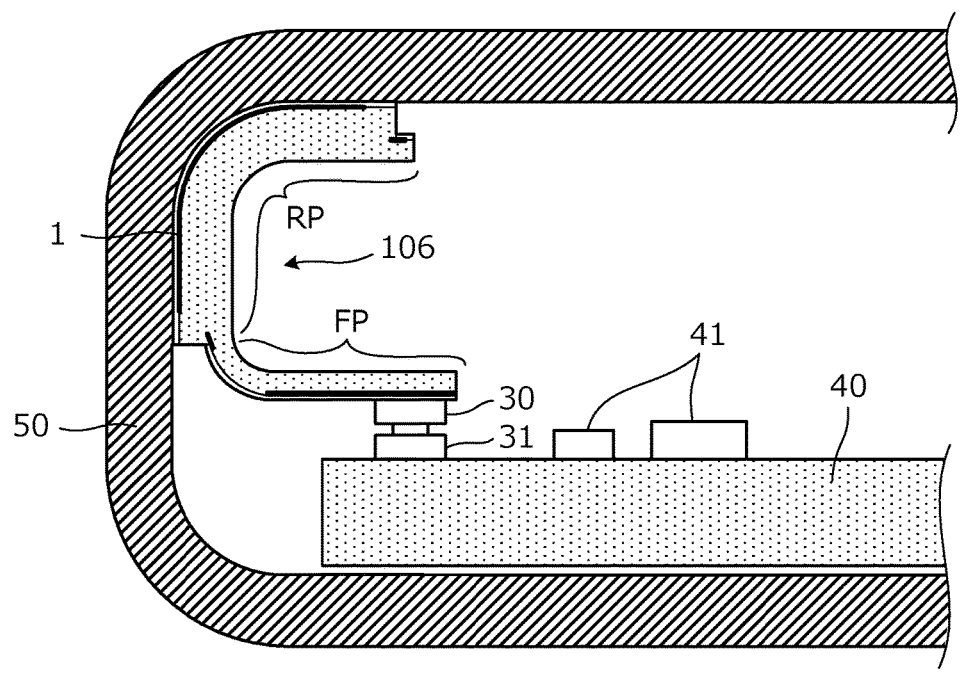
FIG. 13 shows the structure of an antenna module according to a sixth preferred embodiment of the present invention and a principal portion of an electronic device including the antenna module.

FIG. 13 shows the structure of an antenna module 106 according to the sixth preferred embodiment and a principal portion of an electronic device 206 including the antenna module. The structure of the antenna module 106 is the same or substantially the same as the structure of any one of the antenna modules 101 to 103 according to the first to third preferred embodiments. The structure of the circuit substrate 40 and a joint structure with the circuit substrate 40 are the same or substantially the same as those of the electronic device 205 according to the fifth preferred embodiment.

The rigid portion RP of the antenna module 106 is bent in advance to follow the shape of the inner surface of the housing 50. With this structure, the antenna module 106 is able to be readily installed in a limited space in the housing 50.

Other Preferred Embodiments

In the examples shown in, for example, FIG. 1 and FIG. 3, the frame-shaped conductor 5 is preferably provided in a boundary area between the rigid portion RP and the flexible portion FP. However, the entire frame-shaped conductor 5 may be located within the rigid portion RP, for example. Alternatively, the entire frame-shaped conductor 5 may be located within the flexible portion FP, for example.

In the case where the frame-shaped conductor 5 extends over the rigid portion RP and the flexible portion FP, the rigid portion RP and the flexible portion FP are able to be plastically processed into a desired shape also by using the plastic deformation of the frame-shaped conductor 5, for example. Thus, the boundary between the rigid portion RP and the flexible portion FP, on which a stress is likely to concentrate due to a step thereof, is unlikely to be subjected to a stress due to a geometric mismatch. In addition, even in the case where the boundary is subjected to the stress, the frame-shaped conductor 5 is able to define and function as a reinforcement.

In the examples shown in, for example, FIG. 1 and FIG. 3, the frame-shaped conductor 5 preferably has a square frame shape and surrounds the radiating element 1 over the entire circumference in plan view. However, the pattern of the frame-shaped conductor may not close in the circumferential direction but may be partially open, for example. That is, the frame-shaped conductor 5 may have a shape that encompasses a portion of the entire circumference of the radiating element 1 in plan view, for example.

In the examples shown in, for example, FIG. 1 and FIG. 3, the rigid portion RP and the flexible portion FP have substantially the same or substantially the same width in the direction perpendicular or substantially perpendicular to the direction in which the transmission line extends. However, the width of the flexible portion FP may be less than the width of the rigid portion RP, for example. In consideration for the antenna characteristics, the radiating element 1 provided on the rigid portion RP is preferably provided with a predetermined area or width. However, even in the case where the transmission line provided at the flexible portion FP is thin, the transmission line is able to be provided with a predetermined impedance and a low loss of transmission, for example.

In the examples shown in, for example, FIG. 1 and FIG. 3, the frame-shaped conductor 5 is a copper foil pattern as in the case of the other conductor patterns such as the second ground conductor 4. However, the frame-shaped conductor 5 may be made of, for example, a material different from that of the other conductor patterns. For example, the frame-shaped conductor 5 may be made of a hard metallic plate such as stainless steel.

In the examples shown in, for example, FIG. 1 and FIG. 3, the frame-shaped conductor 5 is electrically isolated from the radiating element 1, the signal line 2, and the ground conductors 3 and 4. However, the frame-shaped conductor 5 may be electrically connected to the ground conductors, for example, to control the directivity of the antenna.

In the examples shown in FIG. 11A to FIG. 13, the rigid portion RP or the flexible portion FP bends such that the direction in which the transmission line extends curves. However, the rigid portion RP and the flexible portion FP may bend such that the direction perpendicular or substantially perpendicular to the direction in which the transmission line extends curves, for example.

Finally, the preferred embodiments of the present invention are described above by way of example in all aspects and are not restrictive. It is possible for a person skilled in the art to make a variation and a modification appropriately. For example, the structures described in the different preferred embodiments are able to be partially replaced or combined. The scope of the present invention is not shown by the above preferred embodiments but is shown by the scope of claims. It is intended that the scope of the present invention contains all modifications having the same content and range as the scope of claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna module comprising:
   a resin multilayer substrate including a plurality of base materials that are flexible;
   wherein the resin multilayer substrate includes a rigid portion and a flexible portion;
   a first number of stacked layers of the base materials at the rigid portion is larger than a second number of stacked layers of the base materials at the flexible portion;
   a radiating element including a conductor pattern is provided at the rigid portion;
   a transmission line including a conductor pattern and electrically connected to the radiating element is provided at the flexible portion; and
   the rigid portion bends.

2. The antenna module according to claim 1, wherein the transmission line includes a ground conductor and a signal line, and the radiating element is provided at one of the base materials different from one of the base materials at which the signal line is provided;
   a first interlayer connection conductor that electrically connects the signal line and the radiating element to each other is provided in the rigid portion; and
   the first interlayer connection conductor is non-linear.

3. The antenna module according to claim 2, wherein
a second interlayer connection conductor that electrically connects the ground conductor and the radiating element to each other is provided in the rigid portion; and
the second interlayer connection conductor is non-linear.

4. The antenna module according to claim 1, wherein the flexible portion bends.

5. The antenna module according to claim 1, wherein the flexible portion includes at least a portion of a matching circuit of an antenna including the radiating element.

6. An electronic device, comprising:
the antenna module according to claim 1;
a circuit substrate at which a high-frequency circuit electrically connected to the antenna module is located; and
a housing accommodating the antenna module and the circuit substrate.

7. The electronic device according to claim 6, wherein the antenna module bends along a shape of the housing.

8. The electronic device according to claim 7, wherein the antenna module is in contact with the housing.

* * * * *